(12) United States Patent
Venables et al.

(10) Patent No.: US 8,948,222 B1
(45) Date of Patent: Feb. 3, 2015

(54) LASER DIODE LIGHT SOURCE

(71) Applicant: JDS Uniphase Corporation, Milpitas, CA (US)

(72) Inventors: David Venables, Sunnyvale, CA (US); Erik Paul Zucker, Los Altos, CA (US); Victor Rossin, Mountain View, CA (US); Justin L. Franke, Milpitas, CA (US); Boris Kharlamov, San Jose, CA (US)

(73) Assignee: JDS Uniphase Corporation, Milpitas, CA (US)

( * ) Notice: Subject to any disclaimer, the term of this patent is extended or adjusted under 35 U.S.C. 154(b) by 0 days.

(21) Appl. No.: 14/042,094

(22) Filed: Sep. 30, 2013

(51) Int. Cl.
   *H01S 3/00* (2006.01)
   *H01S 5/0625* (2006.01)
   *H01S 5/40* (2006.01)

(52) U.S. Cl.
   CPC ........... *H01S 5/06251* (2013.01); *H01S 5/4012* (2013.01)
   USPC ................ 372/38.02; 372/29.01; 372/29.014; 372/29.015; 372/31; 372/38.01; 372/38.07

(58) Field of Classification Search
   CPC ....... H01S 5/00; H01S 5/0085; H01S 5/0265; H01S 5/028; H01S 5/0287; H01S 5/04; H01S 5/042; H01S 5/06; H01S 5/0622; H01S 5/068; H01S 5/2206
   USPC ...................... 372/29.01, 29.014, 29.015, 31, 372/38.01–38.02
   See application file for complete search history.

(56) References Cited

U.S. PATENT DOCUMENTS

| | | | |
|---|---|---|---|
| 4,656,638 A | 4/1987 | Tihanyi et al. | 372/49.01 |
| 5,144,634 A | 9/1992 | Gasser et al. | 372/49.01 |
| 5,473,625 A * | 12/1995 | Hansen et al. | 372/96 |
| 5,477,368 A * | 12/1995 | Eskildsen et al. | 398/147 |
| 6,208,678 B1 | 3/2001 | King | 372/72 |
| 6,317,235 B1 | 11/2001 | Hamilton | 398/22 |
| 6,331,908 B1 * | 12/2001 | Adams et al. | 398/200 |
| 6,678,303 B2 | 1/2004 | Yamanaka | 372/50.1 |
| 7,065,117 B2 | 6/2006 | Yamanaka | 372/49.01 |
| 8,319,249 B2 | 11/2012 | Jeong | 257/99 |
| 2002/0163945 A1 | 11/2002 | Kwark | 372/31 |
| 2008/0273563 A1 | 11/2008 | Schmidt et al. | 372/45.01 |
| 2009/0180500 A1 | 7/2009 | Babushkin et al. | 372/30 |
| 2010/0189152 A1 | 7/2010 | Harder et al. | 372/46.01 |

FOREIGN PATENT DOCUMENTS

WO    2007000615    1/2007    ............... H01S 5/02

* cited by examiner

*Primary Examiner* — Dung Nguyen
(74) *Attorney, Agent, or Firm* — JDS Uniphase Corporation

(57) ABSTRACT

A light source including a laser diode, and a method of operating a light source including a laser diode are disclosed. A driving current of the laser diode is dithered to cause a near-field light intensity distribution at an end facet to be perturbed, thereby reducing a time-averaged local intensity of the laser light at the end facet of the laser diode. The reduced time-averaged intensity reduces a possibility of a damage of the end facet.

20 Claims, 7 Drawing Sheets

LASER DIODE LIGHT SOURCE

TECHNICAL FIELD

The present invention relates to light sources, and in particular to light sources utilizing laser diodes, and methods of operating such light sources.

BACKGROUND OF THE INVENTION

Laser diodes are inexpensive and efficient sources of coherent light at high power density and spectral brightness. They are widely used in electro-optical devices ranging from CD players to concrete-cutting industrial lasers. In industrial lasers, laser diodes are frequently used as a pump source for rare earth doped fibers or rods. Laser diodes are also widespread in optical fiber amplifiers, where they are used to pump erbium doped optical fibers.

Reliability is one of the most important parameters of laser diodes. Many factors impact reliability. For example, chip construction, packaging, and heat sinking of laser diode chips can be big factors. When the laser diode chips and packages are properly constructed, the life expectancy of the laser diodes can reach hundreds of thousands of hours.

A common location of failure of a laser diode is its light-emitting end facet, where light intensity is extremely high. Even a minute contamination of the facet, or a minor defect of its crystalline structure, can lead to a catastrophic thermal runaway, forming a melted area or a micro-explosion at the facet, degrading or even completely disabling the laser diode.

The importance of the end facet protection has long been recognized. Tihanyj et al. in U.S. Pat. No. 4,656,638 disclose a method to deposit a passivation layer on laser diode end faces. Yamanaka in U.S. Pat. No. 7,065,117 also discloses a laser diode including a protection layer on its end facet, to strengthen the end facet and reduce a possibility of damage.

Non-radiative electric currents generated in vicinity of laser diode end facets can generate heat, which causes the end facets degradation. Yamanaka in U.S. Pat. No. 6,678,303 discloses a laser diode, in which recesses are formed in the doped layers above and below the p-n junction, to prevent the non-radiative currents from reaching the end facet. Schmidt et al. in US Patent Application Publication 2008/0273563 disclose a ridge-type laser diode, in which degradation of a front section of a ridge-type laser diode is lessened by providing a trench or gap on the ridge between an active section and the front section. The gap limits the carrier injection into the p-n junction to the active section, preventing the carriers from reaching the end facet, thereby lessening chances of a catastrophic failure of the end facet.

Harder et al. in US Patent Application Publication 2010/0189152 disclose a laser diode, in which the end facet degradation due to non-radiative carriers is lessened by controlling the currents flowing in the laser diode by providing a plurality of current-injecting electrodes along the longitudinal axis of the laser diode, and by regulating the current separately in each electrode to generate a desired longitudinal profile of current injection.

In the laser diodes of the prior art, the light-emitting end facets have been protected by including protective coatings or forming trenches or gaps on ridge structures, or by providing multiple electrodes to create a pre-defined current distribution inside the laser chip. It is a goal of the invention to lessen a rate of degradation of an end facet of a multimode laser diode chip without having to modify or otherwise complicate the structure of the laser diode chip.

SUMMARY OF THE INVENTION

In a multimode laser diode, several optical modes are formed inside the active area of a laser diode chip. Interference and instabilities of these optical modes combined with non-uniformities in the structure cause the light to break up into narrow filaments resulting in formation of sharp peaks in a spatial near-field light intensity distribution along the light-emitting end facet(s) of the chip. At the sharp peaks in the spatial intensity distribution, the local near-field intensity or power density is very high.

A common failure mode of a laser diode includes melting of a few micrometers wide section of the end facet due to a comparatively high local absorption of light. The melted section causes the local absorption to increase, eventually extending the damage into the laser cavity. The inventors have realized that the initial high local absorption can be caused by a prolonged exposure of the end facet to the high-intensity peaks formed by the filamentation. The exposure to the high-intensity peaks creates defects in the semiconductor at or near the end facet, and/or in the dielectric passivation coating deposited on the end facet. The portion of the output aperture exposed to the highest intensity peaks fails first, and then propagates into the laser cavity.

The inventors have determined that the spiky near-field intensity distribution at the laser diode end facets can be perturbed, or smoothed out, merely by dithering the laser diode's dc driving current. The driving current dithering causes the near-field high-intensity peaks to "play", that is, to periodically shift and redistribute on the end facets. As a result, the high-intensity peaks smooth out, and the reliability of the laser diode is improved. This improvement can increase a useful lifetime of a laser diode without any modification of the laser diode structure, thus providing a considerable advantage over the prior art.

In accordance with the invention, there is provided a method of operating a light source comprising a first multimode laser diode, the method comprising (a) providing a first dc driving current to the first multimode laser diode to cause a first end facet of the first multimode laser diode to emit first laser light, wherein light emitted by the light source comprises the first laser light, and (b) dithering the first dc driving current.

A peak-to-peak amplitude of dithering of step (b) is selected to be high enough to periodically perturb a near-field light intensity distribution at the first end facet, thereby reducing a time-averaged local intensity of the first laser light at the first end facet. The peak-to-peak amplitude of dithering is low enough to keep a time-domain modulation of the light emitted by the light source under 25%. At the same time, the amplitude of the dithering is selected to be high enough to periodically perturb the near-field light intensity distribution, thereby reducing a time-averaged local intensity of the second laser light at the second end facet.

In one embodiment, the peak-to-peak amplitude of dithering is between 2% and 25% of the first dc driving current, and/or a time period of the dithering is at least 150 microseconds. For efficient dithering, the time period can be made larger than a thermal time constant of the multimode laser diode.

An embodiment of the above method can be used to drive a pair of multimode laser diodes. For driving two laser diodes, the above method can include:

(c) providing a second dc driving current to the second multimode laser diode to cause a second end facet of the second multimode laser diode to emit second laser light, wherein the light emitted by the light source comprises the second laser light, and (d) dithering the second dc driving current in counter-phase with the first dc driving current dithered in step (b).

An amplitude of the dithering of step (d) is selected to be high enough to periodically perturb a near-field light intensity distribution at the second end facet, thereby reducing a time-averaged local intensity of the second laser light at the second end facet. Since the two laser diodes are dithered in counter-phase, the output beam optical power can remain substantially unchanged. Two, four, or more laser diodes can be driven this way.

In accordance with the invention, there is provided a light source comprising: a first multimode laser diode having a first end facet for emitting first laser light; and a driver for providing a first dc driving current to the first multimode laser diode, the driver comprising a ditherer for dithering the first driving current at a peak-to-peak amplitude high enough to periodically perturb a near-field light intensity distribution at the first end facet, thereby reducing a time-averaged local intensity of the first laser light at the first end facet. Light emitted by the light source includes the first laser light.

The peak-to-peak amplitude is selected to be low enough to keep a time-domain modulation of the light emitted by the light source low, for example under 25%. The time period of dithering provided by the ditherer is preferably larger than a thermal time constant of the first multimode laser diode, for a more efficient dithering.

The light source can include a second multimode laser diode having a second end facet for emitting second laser light, wherein the light emitted by the light source comprises the second laser light. For this case, the driver can be configured to provide a second dc driving current to the second multimode laser diode. The ditherer can be configured for dithering the second driving current at a peak-to-peak amplitude high enough to periodically perturb a near-field light intensity distribution at the second end facet, thereby reducing a time-averaged local intensity of the second laser light at the second end facet. The dithering of the second driving current is in counter phase with the dithering of the first driving current.

BRIEF DESCRIPTION OF THE DRAWINGS

Exemplary embodiments will now be described in conjunction with the drawings, in which.

DETAILED DESCRIPTION OF THE INVENTION

While the present teachings are described in conjunction with various embodiments and examples, it is not intended that the present teachings be limited to such embodiments. On the contrary, the present teachings encompass various alternatives and equivalents, as will be appreciated by those of skill in the art.

Figure 1A:
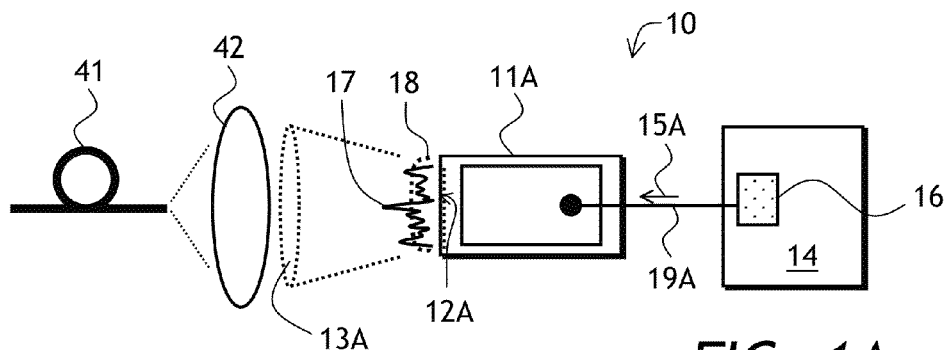
FIG. 1A is a schematic view of a light source of the invention including a multimode laser diode.
Figure 1B:
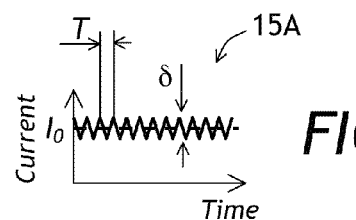
FIG. 1B is a time trace of a driving current of the laser diode of FIG. 1A.
Figure 1C:
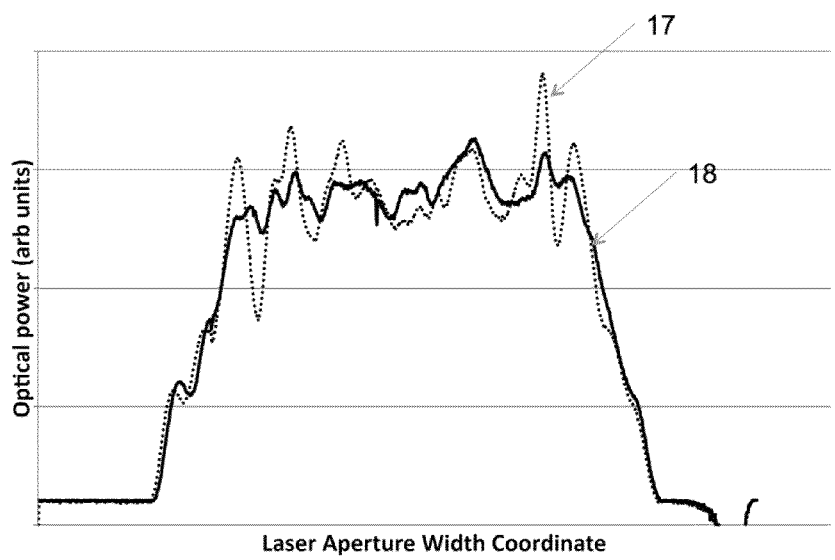
FIG. 1C is a time-averaged light intensity distribution on an end facet of the multimode laser diode of FIG. 1A with and without dithering.

Referring to FIG. 1A, a light source 10 includes a first multimode laser diode 11A having a first end facet 12A for emitting first laser light 13A, and a driver 14 coupled to the laser diode 11A by a cable 19A for providing a first dc driving current 15A to the first multimode laser diode 11A. The driver 14 includes a ditherer 16 for dithering the first driving current 15A. Referring to FIG. 1B with further reference to FIG. 1A, the driving current 15A has an amplitude $I_0$ of its dc component, and at a peak-to-peak amplitude $\delta$ of its dithering component. The amplitude $\delta$ of the dithering is high enough to periodically perturb a near-field light intensity or power density distribution 17 at the first end facet 12A, thereby reducing a time-averaged local intensity of the first laser light 13A at the first end facet 12A. As a result, the time-averaged local intensity forms a distribution 18. The near-field light intensity or power density distribution 17 without dithering, and the time-averaged local intensity or power density distribution 18 with dithering are better seen in FIG. 1C. The near-field light intensity distribution without dithering 17 is rich with small sharp peaks. It is obtained at the dc driving current of 12 Amperes. The time-averaged local intensity distribution with dithering 18 is obtained at the dc driving current amplitude $I_0$ of 12 A, and the peak-to-peak dithering amplitude $\delta$ of 3030 mA, or 25%, at the frequency of 25 kHz, and the output power level of 11 W.

Generally, the peak-to-peak dithering amplitude $\delta$ is selected to be low enough to keep a time-domain modulation of the first laser light 13A low, preferably under 25%, In many practical cases, the peak-to-peak amplitude of dithering is between 7% and 25% of the amplitude $I_0$ of the first driving current 15A.

In one embodiment, a time period T of the dithered current 15A is larger than a thermal time constant of the first multimode laser diode 11A, so that the dithering will effectively modulate the temperature of the first multimode laser diode 11A. For example, the time period can be at least 150 microseconds. The driving profile can be triangular as shown in FIG. 1B for more uniform smoothing, or it can be sinusoidal or any other suitable shape.

The peak intensity averaging is more efficient in multimode laser diodes having the front facet 12A at least 50 micrometers wide. At the emission wavelength of between 800 nm and 1000 nm, more than 4-5 lateral optical modes are present at the 50 micrometers wide front facet 12A. The more modes are present, the more efficient the smoothing action of the dithering generally becomes.

Figure 2:
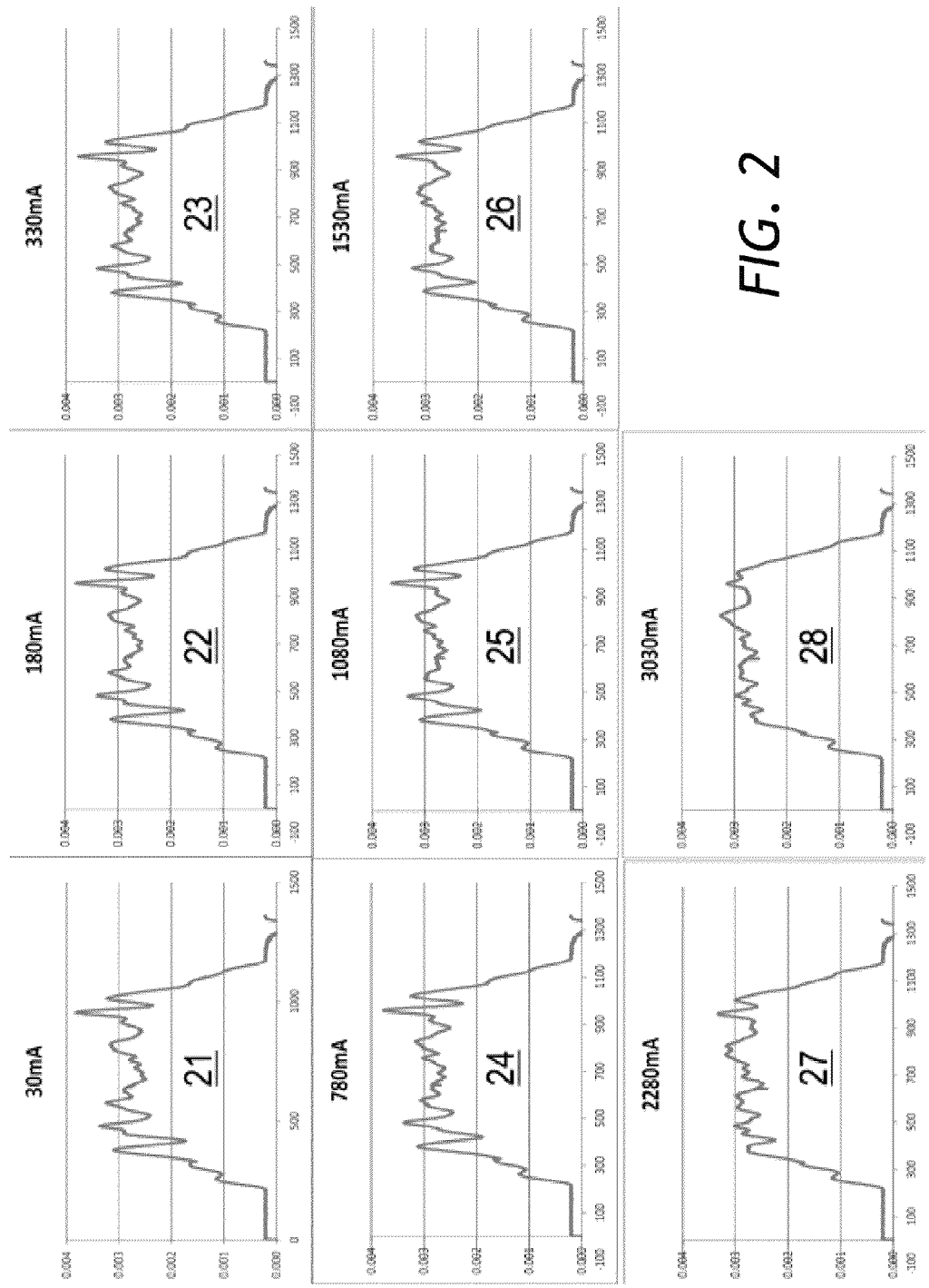
FIG. 2 is the distributions of FIG. 1C at different dithering currents.
Figure 3:
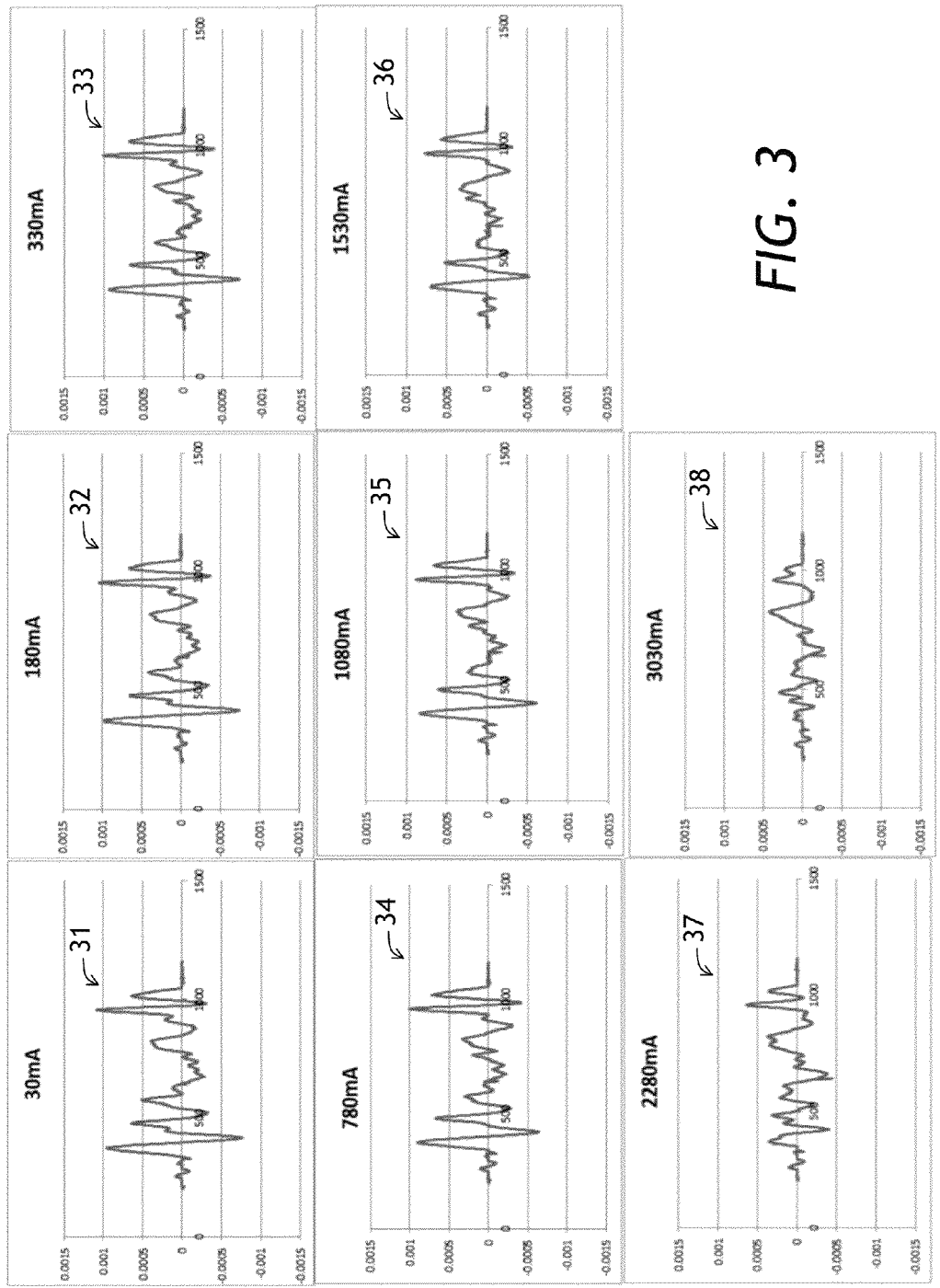
FIG. 3 is a difference between an ideally smooth distribution and the time-averaged distributions of FIG. 2 at the different dithering currents.

Turning to FIG. 2, the time-averaged 18 light intensity distributions are shown at 21, 22, 23, 24, 25, 26, 27, and 28. The laser diode 10 has the width of the laser aperture 12A of 100 micrometers and is driven at the dc current 15A amplitude $I_0$ of 12 Amperes to produce 11 W of optical power. The horizontal axes denote the laser aperture 12A width coordinate, and the vertical axes denote light intensity in arbitrary units. The distributions 21, 22, 23, 24, 25, 26, 27, and 28 correspond to the peak-to-peak dithering amplitudes δ of 30 mA, 180 mA, 330 mA, 780 mA, 1080 mA, 1530 mA, 2280 mA, and 3030 mA, respectively; or 0.25%; 1.5%; 2.75%; 6.5%; 9%; 12.75%; 19% and 25.3% of the dc current amplitude $I_0$, respectively. One can see that as the ratio of the dithering current amplitude δ to the dc current amplitude $I_0$ increases, the time-averaged optical power distributions 21 to 28 become more and more smooth. The smoothing effect is better seen in FIG. 3, wherein differences 31, 32, 33, 34, 35, 36, 37, and 38 between time-averaged 18 light intensity distributions 21, 22, 23, 24, 25, 26, 27, and 28 of FIG. 2, and an ideally smooth distribution, are shown for the same dithering current amplitudes δ of 30 mA, 180 mA, 330 mA, 780 mA, 1080 mA, 1530 mA, 2280 mA, and 3030 mA, respectively. In FIG. 3, the horizontal axes denote the laser aperture width coordinate, and the vertical axes denote light intensity difference in arbitrary units.

The light source 10 can be used to pump rare-earth doped laser rods and optical waveguides. To illustrate this, the light source 10 in FIG. 1A is shown to include an optional rare-earth doped optical fiber 41, for example erbium (Er) or ytterbium (Yb) doped fiber, which is optically coupled to the multimode laser diode 11A via an optional coupling lens 42. In operation, the multimode laser diode 11A emits the laser light 13A, which pumps the rare-earth doped optical fiber 41. The dithering of the driving current 15A allows one to extend the lifetime of the light source 10 by preserving the laser diode 11A. For pumping of Er or Yb doped fiber, the laser diode 11A can lase in the 800 nm-1000 nm wavelength range. Such lasers frequently utilize GaAs—InAlGaAs material system including GaAs material.

Figure 4:
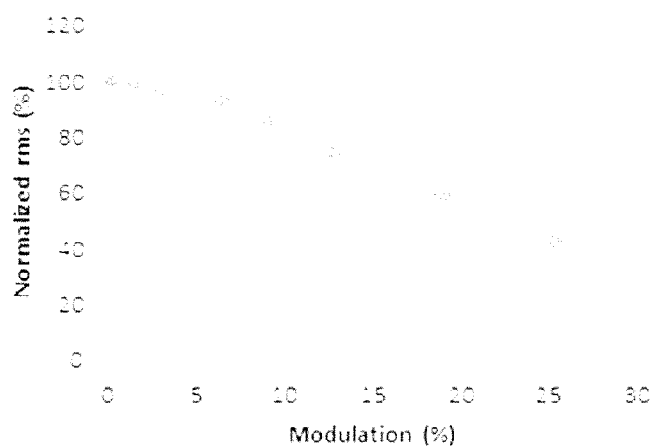
FIG. 4 is a dependence of a peak intensity reduction due to the smoothing of the time-averaged light intensity distributions on the peak-to-peak amplitude of the dithering at the dc driving current of 12 A.
Figure 5:
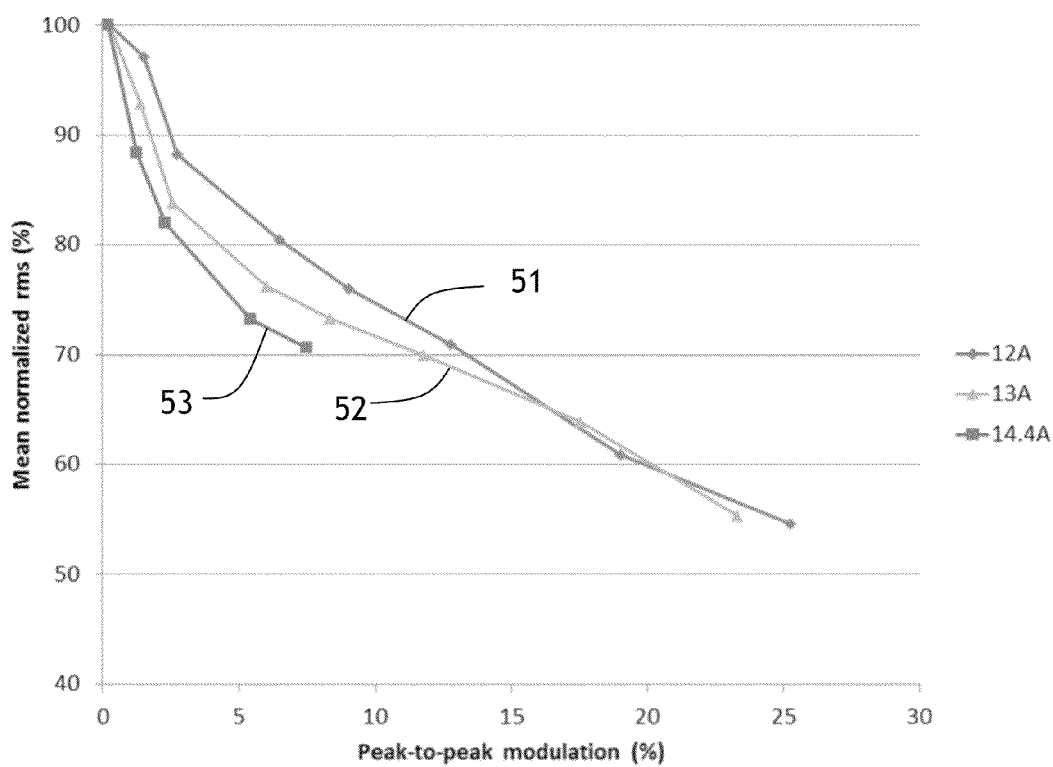
FIG. 5 is a dependence of an average peak intensity reduction due to the smoothing of time-averaged light intensity distributions of 11 laser diodes on the peak-to-peak amplitude of the dithering at different values of the dc driving current.

Turning to FIG. 4, a normalized root-mean-square (RMS) reduction of light intensity for the single laser diode 11A is plotted vs. peak-to-peak dithering current amplitude δ in percents, at the dithering frequency of 25 kHz, and the dc driving current amplitude $I_0$ of 12 A. One can see that the modulation of 25% more than halves RMS value. In FIG. 5, a dependence of mean normalized RMS reduction is plotted at the dc driving current amplitude L of 12 Amperes (curve 51), 13 Amperes (curve 52), and 14.4 Amperes (curve 53). FIG. 5 shows mean values averaged over 11 diodes.

Figure 6A:
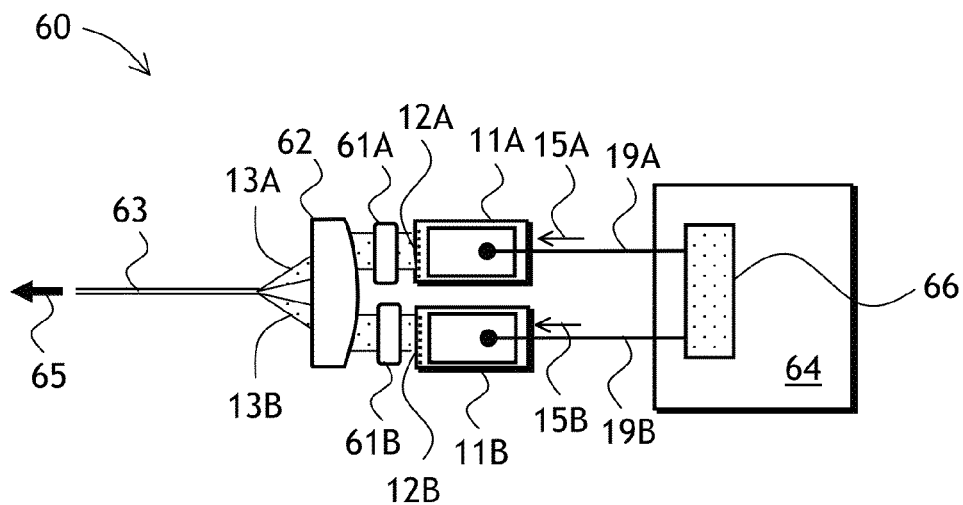
FIG. 6A is a schematic view of an embodiment of a light source of the invention including two laser diodes.

Referring now to FIG. 6A, a light source 60 is similar to the light source 10 of FIG. 1A. The light source 60 has not one but two multimode laser diodes, specifically the first laser diode 11A and a second laser diode 11B. The second laser diode has a second facet 12B for emitting a second laser beam 13B. A laser driver 64 is configured to provide not only the first 15A but also a second 15B dc driving current to the first 11A and second 11B multimode laser diodes, via cables 19A and 19B, respectively, or via other means such as a common cable, not shown. In the embodiment of FIG. 6A, the first 13A and second 13B laser beams are collected by first 61A and second 61B fast-axis collimated cylindrical lenses, and is directed towards a slow-axis collimating lens 62, which focuses the first 13A and second 13B laser beams into a multimode optical fiber 63, to combine into light 65 emitted by the light source 60. Other beam-combining optics, including prisms or mirrors, can be used, as known to a person skilled in the art.

Figure 6B:
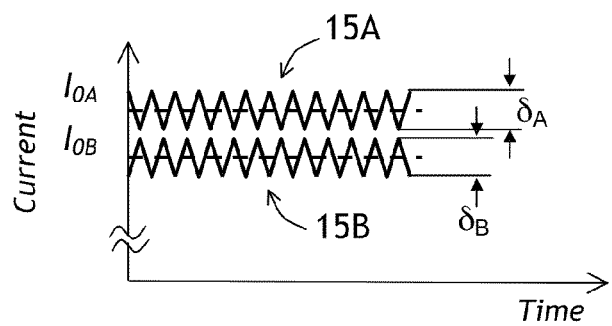
FIG. 6B is a time trace of driving currents of the laser diodes of FIG. 6A.

The driver 64 includes a ditherer 66 configured for dithering the first 15A and second 15B driving currents. Referring to FIG. 6B with further reference to FIG. 6A, the first 15A and second 15B driving currents having amplitudes $I_{0A}$ and $I_{0B}$ are dithered at peak-to-peak amplitudes $δ_A$ and $δ_B$, respectively, which are high enough to periodically perturb near-field light intensity distributions, not shown, at the first 12A and second 12B end facets, respectively, thereby reducing a time-averaged local intensity of the first 13A and second 13B laser light at the first 12A and second 12B end facets, respectively, as explained above on the example of the first laser diode 11A with reference to FIG. 1C, FIG. 2, and FIG. 3.

As shown in FIG. 6B, the dithering of the second driving current 15B is in counter phase with the dithering of the first driving current 15A. Due to the counter-phase dithering, the time domain modulation (TDM) i.e., variation in the emitted optical power of the first 13A and second 13B laser beams is also in counter-phase, and thus tend to cancel or at least partially compensate each other, lessening the TDM of the combined output light 65 of the light source 60. Thus, when two laser diodes 11A and 11B are used, the dithering amplitudes $δ_A$ and $δ_B$ can be further increased to better average out sharp peaks in the near-field light intensity distributions of the laser diodes 11A and 11B, substantially without increasing TDM of the combined output light 65 of the light source 60. The output multimode fiber 63 can be replaced with another waveguide optically coupled to the first 12A and second 12B end facets, or omitted entirely for free-space coupling to another optical element, such as an active laser fiber or a laser rod, to be pumped by the light source 60.

Figure 7A:
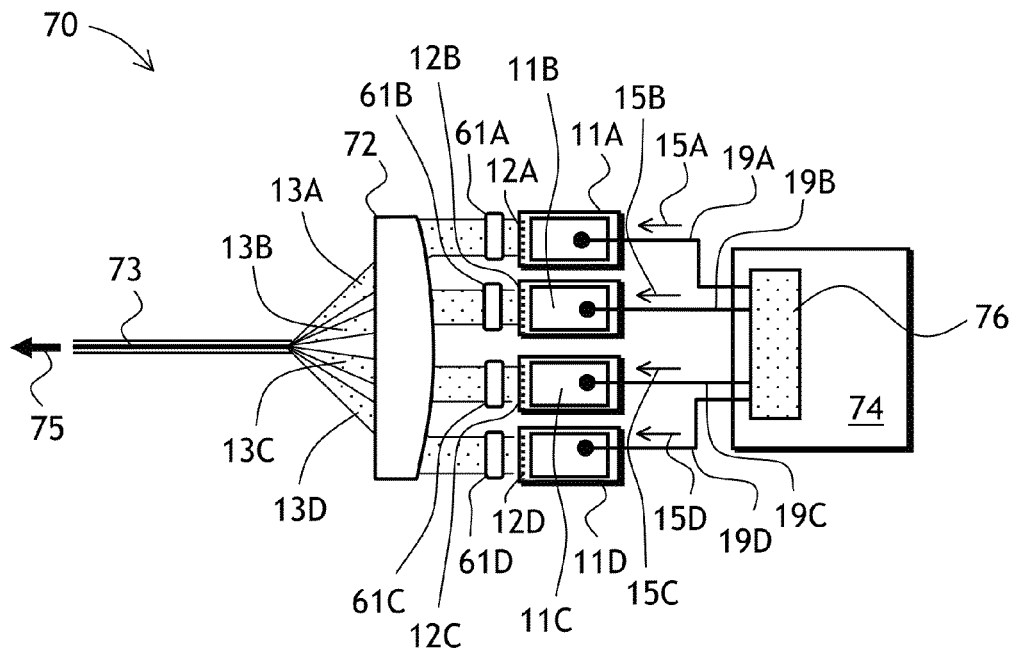
FIG. 7A is a schematic view of an embodiment of a light source of the invention including four laser diodes.

In accordance with the invention, two or more pairs of laser diodes can be combined and dithered in counter-phase within each pair, to reduce TDM while reducing localized peak intensity at their respective end facets. Turning now to FIG. 7A, a light source 70 is similar to the light source 60 of FIG. 6A. The light source 70 includes not two but four multimode laser diodes 11A, 11B, 11C, and 11D having four facets 12A, 12B, 12C, and 12D, respectively, for emitting four laser beams 13A, 13B, 13C, and 13D, respectively. A laser driver 74 is configured to provide four driving currents 15A, 15B, 15C, and 15D to the multimode laser diodes 11A, 11B, 11C, and 11D, via cables 19A, 19B, 19C, and 19D, respectively, or via other means such as a common cable. In the embodiment of FIG. 7A, the laser beams 13A, 13B, 13C, and 13D are collected by fast-axis collimated cylindrical lenses 61A, 61B, 61C, and 61D, and is directed towards a slow-axis collimating lens 72, which focuses the laser beams 13A to 13D into a multimode optical fiber 73, to combine the laser beams 13A to 13D into a light beam 75 emitted by the light source 70. Other beam-combining optics, and/or other beam delivery waveguides can be used, as known to a person skilled in the art.

Figure 7B:
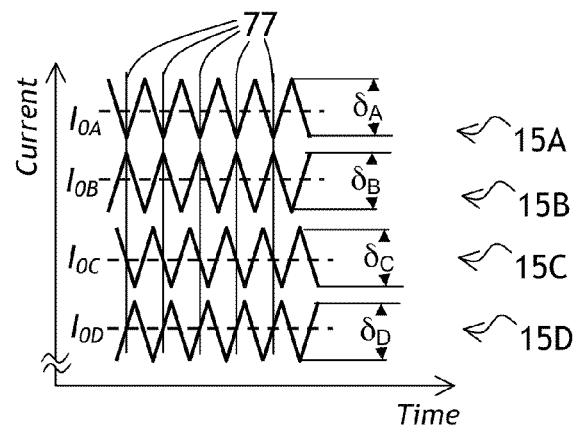
FIG. 7B is a time trace of driving currents of the laser diodes of FIG. 7A.

The driver 74 includes a ditherer 76 configured for dithering the driving currents 15A to 15D. Referring to FIG. 7B with further reference to FIG. 7A, the four driving currents 15A, 15B, 15C, and 15D having amplitudes $I_{0A}$, $I_{0B}$, $I_{0C}$, and $I_{0D}$ are dithered at peak-to-peak amplitudes $δ_A$, $δ_B$, $δ_C$, and $δ_D$, respectively, which are high enough to periodically perturb near-field light intensity distributions, not shown, at the four end facets 12A, 12B, 12C, and 12D, respectively, thereby reducing a time-averaged near-field light intensity of the laser beams 13A to 13D at the end facets 12A to 12D, respectively. As shown in FIG. 7B with lines 77, the dithering of the second driving current 15B is in counter phase with the dithering of the first driving current 15A; the dithering of the fourth driving current 15D is in counter phase with the dithering of the third driving current 15C; and the dithering of the third 15C and fourth 15D driving currents is at 90 degrees phase shift with respect to the dithering of the first driving current 15A. Due to the counter-phase dithering, the TDM of the first 13A and second 13B laser beams; and second 13B and fourth 13D laser beams is in counter-phase, and thus tends to cancel or at least partially compensate each other, lessening the TDM of the combined output light 75 of the light source 70.

Figure 8:
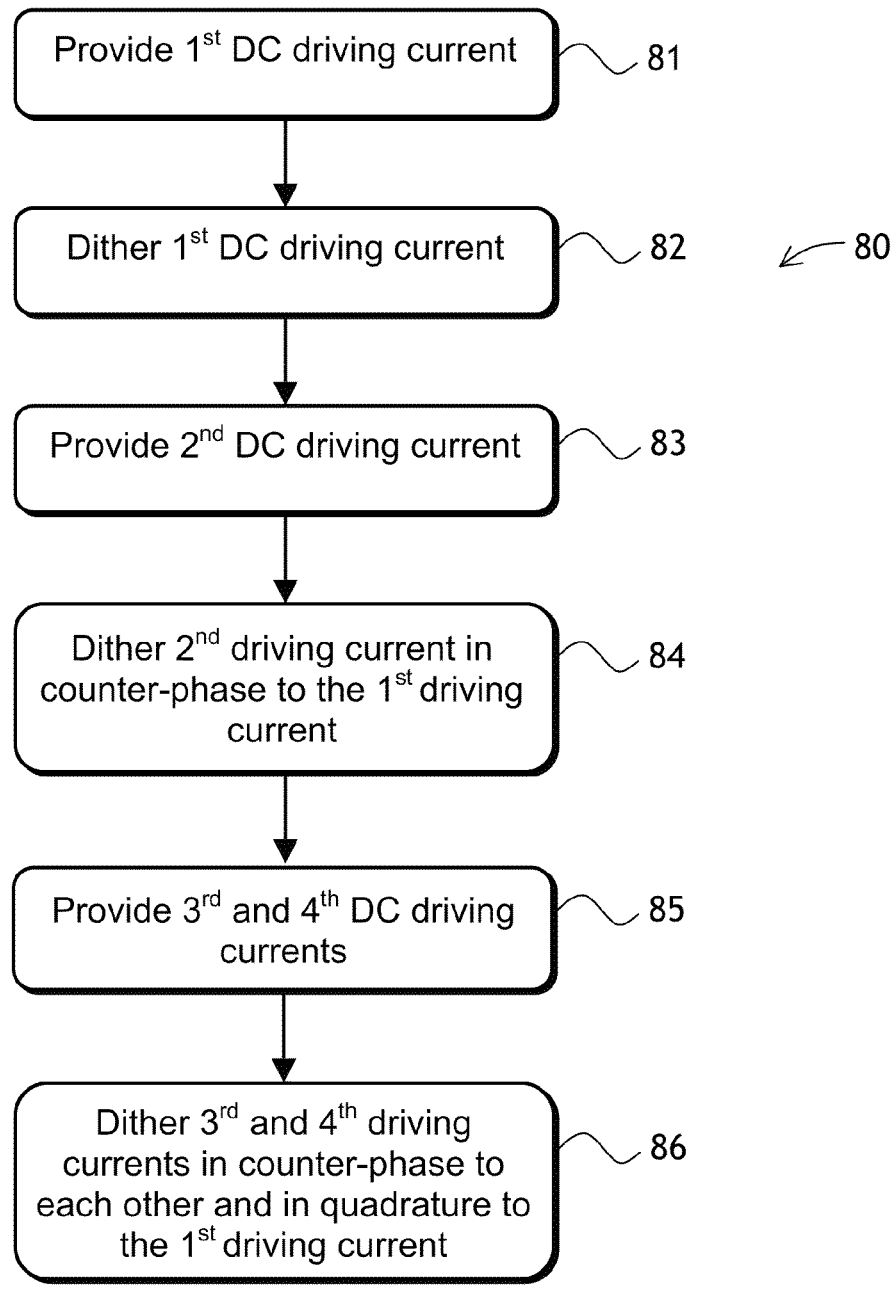
FIG. 8 is a flow chart of an exemplary method of operating a light source according to the invention.

Turning now to FIG. 8, a method 80 of operating a laser source is presented. In a step 81, the first dc driving current 15A is applied to the first multimode laser diode 11A to cause the first end facet 12A to emit the first laser light 13A. In a step 82, the first dc driving current 15A is dithered. The peak-to-peak amplitude δ of dithering of step 82 is selected to be high enough to periodically perturb the near-field light intensity distribution 17 at the first end facet 12A, thereby reducing a time-averaged local intensity 18 of the first laser light 13A at the first end facet 12A. The peak-to-peak amplitude δ of dithering is also low enough to keep a time-domain modulation of the light emitted by the light source under 25%, and more preferably under 7%. As explained above, it is preferable that the peak-to-peak amplitude of dithering be between 2% and 25% of the first dc driving current. A general goal is to modulate the driving current 15A just enough to provide an appreciable, for example at least 15%, reduction of the averaged local peak intensity of the first laser light at the first end facet, with as little perturbation of the output optical power as practical.

It is preferable that the first laser diode 15A be driven with the dithering provided by step 82, to reduce a chance of catastrophic failure, especially at high currents. For example, first laser diode 15A can be driven with the dithering turned on at least for 10% of its expected lifetime. For a 10,000 hours of a lifetime, that means driving the first laser diode 15A for at least 1000 hours. Of course, it is preferable that the first laser diode 15A, once installed into the light source 10 of FIG. 1A, is always driven with the dithering turned on.

The next two steps of the method 80 are optional, being applicable to the light sources 60 of FIG. 6A and 70 of FIG. 7B. In a step 83, the second dc driving current 15B is provided to the second multimode laser diode 11B to cause its end facet 12B to emit second laser light or beam 13B. In a step 84, the second dc driving current 15B is dithered in counter-phase with the first dc driving current 15A dithered in step 82. The peak-to-peak amplitude δ of dithering of the second dc driving current 15B is selected to be high enough to periodically perturb a near-field light intensity distribution at the second end facet 12B, thereby reducing a time-averaged local intensity of the second laser light 13B at the second end facet 12B.

The next two steps of the method 80 are optional, being applicable to the light source 70 of FIG. 7B. In a step 85, the third 15C and fourth 15D dc driving currents are applied to the third 11C and fourth 11D multimode laser diodes, respectively, to cause their respective end facets 12C and 12D to emit third and fourth laser beams 13C and 13D, respectively. Finally, in a step 86, the third and fourth dc driving currents 15C and 15D are dithered in counter-phase with respect to each other and at 90 degrees (in quadrature) with respect to the first dc driving current 15A dithered in the step 82. Again, the amplitudes δ of dithering of the third and fourth dc driving currents 15C and 15D are selected to be high enough to periodically perturb near-field light intensity distributions at the third 12C and fourth 12D end facets, thereby reducing averaged local peak intensities of the third 13C and fourth 13D laser beams at the third 12C and fourth 12D end facets, respectively.

The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A method of operating a light source comprising a first multimode laser diode, the method comprising:
   (a) providing a first dc driving current to the first multimode laser diode to cause a first end facet of the first multimode laser diode to emit a first laser light, wherein light emitted by the light source comprises the first laser light, and
   (b) dithering the first dc driving current;
   wherein a peak-to-peak amplitude of dithering of step (b) is selected to be high enough to periodically perturb a near-field light intensity distribution at the first end facet, thereby reducing a time-averaged local intensity of the first laser light at the first end facet, wherein the peak-to-peak amplitude of dithering is low enough to keep a time-domain modulation of the light emitted by the light source under 25%.

2. The method of claim 1, wherein in step (b), the peak-to-peak amplitude of dithering is selected to be low enough to keep the time-domain modulation of the light emitted by the light source under 7%.

3. The method of claim 2, wherein a time profile of dithering in step (b) is triangular.

4. The method of claim 3, wherein the peak-to-peak amplitude of dithering is between 2% and 25% of the first dc driving current.

5. The method of claim 1, wherein the peak-to-peak amplitude of dithering is between 2% and 25% of the first dc driving current.

6. The method of claim 1, wherein in step (b), the averaged local peak intensity of the first laser light at the first end facet is reduced by at least 15% due to the dithering.

7. The method of claim 1, wherein step (b) is performed at least for 10% of an expected lifetime of the light source.

8. The method of claim 1, wherein a time period of dithering of step (b) is larger than a thermal time constant of the first multimode laser diode.

9. The method of claim 1, wherein a time period of the dithering of step (b) is at least 150 microseconds.

10. The method of claim 1, wherein the light source further comprises a second multimode laser diode, the method further comprising
    (c) providing a second dc driving current to the second multimode laser diode to cause a second end facet of the second multimode laser diode to emit second laser light, wherein the light emitted by the light source comprises the second laser light, and
    (d) dithering the second dc driving current in counter-phase with the first dc driving current dithered in step (b);
    wherein an amplitude of dithering of step (d) is selected to be high enough to periodically perturb a near-field light intensity distribution at the second end facet, thereby reducing a time-averaged local intensity of the second laser light at the second end facet.

11. The method of claim 10, wherein the light source further comprises third and fourth multimode laser diodes, the method further comprising
    (e) providing third and fourth dc driving currents to the third and fourth multimode laser diodes, respectively, to cause third and fourth end facets of the third and fourth multimode laser diodes to emit third and fourth laser light, respectively, wherein the light emitted by the light source comprises the third and fourth laser light, and (f) dithering the third and fourth dc driving currents in counter-phase with respect to each other and at 90 degrees to the first dc driving current dithered in step (b);

wherein amplitudes of dithering of step (e) are selected to be high enough to periodically perturb near-field light intensity distributions at the third and fourth end facets, thereby reducing averaged local peak intensities of the third and fourth laser light at the third and fourth end facets, respectively.

12. A light source comprising: a first multimode laser diode having a first end facet for emitting a first laser light; and a driver for providing a first dc driving current to the first multimode laser diode, the driver comprising a ditherer for dithering the first driving current at a peak-to-peak amplitude high enough to periodically perturb a near-field light intensity distribution at the first end facet, thereby reducing a time-averaged local intensity of the first laser light at the first end facet, wherein in operation, light emitted by the light source comprises the first laser light, wherein the peak-to-peak amplitude is low enough to keep a time-domain modulation of the light emitted by the light source under 25%.

13. The light source of claim 12, wherein a time period of dithering provided by the ditherer is larger than a thermal time constant of the first multimode laser diode.

14. The light source of claim 12, wherein the ditherer is configured to provide the peak-to-peak dithering amplitude of between 2% and 25% of the first dc driving current.

15. The light source of claim 12, wherein the end facet has a width of at least 50 micrometers.

16. The light source of claim 12, wherein the first laser diode includes GaAs.

17. The light source of claim 12, further comprising a rare earth-doped optical fiber optically coupled to the laser diode, wherein in operation, the first laser light pumps the rare earth-doped optical fiber.

18. The light source of claim 12, further comprising a second multimode laser diode having a second end facet for emitting second laser light, wherein the light emitted by the light source comprises the second laser light;

wherein the driver is configured to provide a second dc driving current to the second multimode laser diode, and wherein the ditherer is configured for dithering the second driving current at a peak-to-peak amplitude high enough to periodically perturb a near-field light intensity distribution at the second end facet, thereby reducing a time-averaged local intensity of the second laser light at the second end facet, wherein the dithering of the second driving current is in counter phase with the dithering of the first driving current.

19. The light source of claim 18, further comprising a waveguide optically coupled to the first and second end facets.

20. The light source of claim 18, further comprising third and fourth multimode lasers having third and fourth end facets for emitting third and fourth laser light, respectively, wherein light emitted by the light source comprises the third and fourth laser light;

wherein the driver is configured to provide third and fourth dc driving currents to the third and fourth multimode laser diodes, respectively, and wherein the ditherer is configured for dithering the third and fourth driving currents, thereby reducing a time-averaged local intensity of the third and fourth laser light at the third and fourth end facets, respectively, wherein the dithering of the third and fourth driving currents is in counter phase with each other and at 90 degrees phase shift with respect to the dithering of the first driving current.

* * * * *